United States Patent
Tran et al.

[11] Patent Number: 5,368,882
[45] Date of Patent: Nov. 29, 1994

[54] PROCESS FOR FORMING A RADIATION DETECTOR

[75] Inventors: Nang T. Tran, Lake Elmo; Kenneth R. Paulson, Woodbury, both of Minn.

[73] Assignee: Minnesota Mining and Manufacturing Company, St. Paul, Minn.

[21] Appl. No.: 111,994

[22] Filed: Aug. 25, 1993

[51] Int. Cl.$^5$ .............................................. D05D 5/06
[52] U.S. Cl. ..................................... 427/65; 427/69; 427/125; 427/126.2; 427/255.2; 427/419.1
[58] Field of Search ................ 427/65, 69, 125, 126.2, 427/255.2, 410.1

[56] References Cited

U.S. PATENT DOCUMENTS

| | | | |
|---|---|---|---|
| 2,705,764 | 4/1955 | Nicall | 427/70 |
| 3,672,931 | 6/1972 | Grosso et al. | 427/68 |
| 4,011,454 | 3/1977 | Lubowski et al. | 250/483 |
| 4,209,705 | 6/1980 | Washida et al. | 250/486 |
| 4,236,077 | 11/1980 | Sonoda et al. | 250/361 R |
| 4,287,230 | 9/1981 | Galves et al. | 427/70 |
| 4,415,609 | 11/1983 | Davis et al. | 427/70 |
| 4,437,011 | 3/1984 | Noji et al. | 250/486.1 |
| 5,153,438 | 10/1992 | Kingsely et al. | 250/370.09 |
| 5,171,996 | 12/1992 | Perez-Mendez | 250/361 R |

FOREIGN PATENT DOCUMENTS

| | | | |
|---|---|---|---|
| 0175578 | 3/1986 | European Pat. Off. | G21K 4/00 |
| 22218 A/89 | 10/1989 | Italy . | |
| WO93/03496 | 7/1992 | WIPO | H01L 21/306 |

OTHER PUBLICATIONS

"Enhanced Structure in CsI Layer by Substrate Patterning", Jing et al., IEEE Trans. Nucl. Sci., vol. 39, No. 5 (Oct. 1992).

Primary Examiner—Shrive Beck
Assistant Examiner—Benjamin L. Utech
Attorney, Agent, or Firm—Gary L. Griswold; Walter N. Kirn; Gregory A. Evearitt

[57] ABSTRACT

A process for forming a phosphor comprising the steps of:
(a) providing a substrate for deposition and growth of an alkali halide phosphor,
(b) forming a patterned surface on the substrate comprising a plurality of mesas, each of the mesas having an incline, a decline, and a horizontal surface, the mesas being separated from one another by horizontal segments of the substrate and wherein:
  (i) the ratio of the height of each of the mesas to the width of the horizontal segments is in the range of about 1:20 to 1:4;
  (ii) the ratio of the width of each of the mesas to the width of the horizontal segments is in the ratio of about 1:30 to 1:4; and
  (iii) the angles of incline and decline of each of the mesas are between about 5° to 85°; and
(c) depositing an alkali halide phosphor on the patterned surface of the substrate of step (b), thereby forming cracks, in the deposited phosphor, originating from the inclines and/or declines of each of the mesas.

25 Claims, 1 Drawing Sheet

PROCESS FOR FORMING A RADIATION DETECTOR

FIELD OF THE INVENTION

This invention relates to a process for forming a phosphor and in particular, it relates to a process for forming a phosphor, for converting X-ray radiation, on a substrate having a predetermined configuration.

BACKGROUND OF THE ART

One of the essential components of a radiation imaging device is a radiation input converter. In most applications of position-sensitive radiation detection, conventional radiography, and digital radiography, a phosphor screen is used to convert the incoming radiation into visible light which is then detected on film, on a photodiode, or other position sensing device. Such phosphor screens are usually required to have high resolution and high output brightness characteristics. The brightness of the light output is, in part, a function of the thickness of the phosphor layer, which determines the amount or X-ray energy absorbed, and of the inherent phosphor efficiency in converting X-ray radiation into detectable light. However, as this layer is made thicker, the spatial resolution is decreased because light photons emitted in response to the absorption of X-ray photons or charged particles will scatter within the phosphor layer and emerge from the phosphor surface at points further away in the transverse direction. Such lateral light spreading is caused by two factors. First, the phosphor emits light photons isotropically from the point at which a radiation particle, such as the X-ray photon, is absorbed. Second, even light photons which are traveling more or less perpendicularly to the surface of the phosphor layer may be scattered in the lateral direction before they reach the surface. Thus, the actual thickness of the phosphor layer is a compromise between the desired high radiation absorption that may be obtained from thicker layers and the required or desired resolution which improves as the thickness of the layer is reduced. Clearly, it would be desirable to increase the thickness of the phosphor layer without degrading the spatial resolution. This can be accomplished by suppressing the lateral light spread within the layer. Certain techniques for forming small cracks perpendicular to the phosphor surface to limit light spread have been developed, and the characteristics of evaporated CsI(Tl) layers coupled to a Si:H photodiode have been disclosed, for example, in Assignee's U.S. Pat. No. 5,302,423, incorporated by reference herein.

The incorporation of cracks in the phosphor layer, which are essentially perpendicular to the surface of the phosphor layer, exhibit enhancement of the resolution of light emitted from the phosphor in response to incident X-rays. A phosphor "cell" is formed when a continuous coating of phosphor is surrounded by a boundary of cracks. An emitted photon from the interaction of the phosphor with an X-ray will be effectively contained within a phosphor cell due to the presence of a crack or gap in the phosphor. If the angle of incidence of the photon is sufficiently large, the photon will be reflected back into the phosphor cell by total internal reflection, thereby isolating the photons generated in one cell from an adjacent cell. Alternatively, if the space between adjacent cells is filled with either an opaque or reflective material, the photons generated within the cell will be absolutely contained within the cell.

One early approach to form a light-guiding structure in a luminescent layer was to deposit a thin scintillation layer of CsI on the substrate and impart thermal shocks to the CsI layer, producing cracks therein due to the different thermal expansion coefficients of the substrate and the CsI layer. Another light-guide structure fabrication method was made in which the substrate had a very thin $Al_2O_3$ layer which is caused to form a mosaic of cracks due to imparting thermal shocks, forming small grooves on the substrate. This type of cracked or net-like mosaic substrate further enhances the columnar structure of the phosphor material deposited on it. However, a phosphor layer prepared by these processes has the following drawbacks: 1) the columns defined by cracks have an irregular structure, which decrease the light collimation and thus, decrease the resolution; and 2) it is difficult to ensure the reproducibility of the size or position of the randomly formed columns. For these reasons, CsI X-ray radiation layers (150–200 $\mu$m thick) made by these methods have spatial resolution of only 4 to 6 line-pair/mm at the 10 percent level. It is desirable to generate a spatial resolution of at least 10 lp/mm for use in diagnostic radiography.

U.S. Pat. No. 4,209,705 teaches the columnar growth of CsI phosphor over a metal pattern which is deposited in the grooves between a random mosaic pattern formed on a substrate. The metal protrusions are used to intensify the image sharpness by restricting lateral illumination (spreading within the phosphor layer) via reflection off the metal pattern. Most of the collimating of the light occurs due to the total internal reflection within the columns of formed phosphor. The random mosaic pattern is an insulating layer formed on an aluminum substrate in one embodiment. In another embodiment, the mosaic forming layer is from a different plated material such as molybdenum oxide which is treated to form random cracks in the material. See also U.S. Pat. No. 4,236,077 for a similar approach.

"*Enhanced Columnar Structure in CsI Layer by Substrate Patterning*", Jing et at., *IEEE Trans. Nucl. Sci.*, Vol. 39, No. 5 (Oct. 1992) discloses the use of photolithography to form a mesh-patterned substrate onto which a CsI phosphor layer is deposited. The columnar growth of the thallium doped CsI on the mesh pattern causes the initiation of a crack formed on the ridges of the mesh pattern, and the deformation stress controls further growth to propagate the crack. In this teaching, the benefit of initiating the growth over a ridge serves to enhance the parallel columnar growth of the phosphor, as it is shown that without the presence of ridges the phosphor grows with discontinuous random cracks oriented at a multiplicity of angles relative to the substrate. The width of the cracks formed are on the same order as the width of a discontinuity between adjacent columns in the structure. If the CsI layer is allowed to grow far enough, the cracks vanish at the top of the layer at about 450 microns in height.

U.S. Pat. No. 4,437,011 teaches the use of phosphor seed particles which are vapor deposited onto a substrate, which serve as nucleation sites for the subsequent deposition of additional phosphor which will grow as a series of columns vertically from the seed, with a crack or discontinuity between adjacent columns corresponding to the placement of neighboring seed particles. To permit a continuous layer to be formed on the surface of the crack separated columns, another phosphor layer is deposited over the columns in such a manner so as to form a continuous film for subsequent deposition of a transparent conductive layer for conversion of the light to photoelectrons.

E. P. Application No. 0,175,578 teaches the use of a phosphor which does not contain a binder to improve the response to irradiation. Mention is made of the advantage of having the phosphor align itself into discrete blocks, either formed on a PET sheet, or formed by treating an oxide surface.

U.S. Pat. No. 4,011,454 discloses a phosphor screen for converting X-rays to light which includes a large number of discrete columns of the phosphor material, such as doped CsI, with the spaces therebetween preferably filled with a reflective substance which itself may be a phosphor (e.g., $Gd_2O_2S$ or $La_2O_2S$). Because of the resulting inhibition of lateral spread of light within the phosphor screen, it may be made thicker than conventional screens while achieving at least as high a resolution and contrast, thereby increasing brightness (and thus requiring lower X-ray "doses"). The patent also discloses a method for making the screen which includes using a patterned substrate and wide-angle vapor deposition (as in a hot-wall evaporator) so as to deposit the phosphor only on the raised portions of the substrate.

In the method of '454, a pattern is formed on the substrate to be used for deposition of the phosphor. The pattern used generally has a "checkerboard" pattern of straight-walled, square-based mesas separated by slots or grooves typically 100 microns in width. This substrate is then placed in a specially designed vacuum evaporation apparatus that is equipped with heated walls and a heated plate which serves as a shield placed between the evaporation boat and the substrate. When the wails and shield of the system are heated sufficiently, any phosphor particles in the vapor phase will reflect from, rather than stick to, these heated surfaces. In this manner, the phosphor, which is rapidly evaporated from the boat, will preferentially approach the deposition surface from a (somewhat controllable) large angle of incidence. As phosphor particles intercept the cooler surface of the substrate, deposition occurs preferentially on the raised portions of the mesas since the large angle of incidence shields the bottoms of the grooves from deposition. In this way, the mesas grow in height, remaining separated by a gap. As the deposition continues, the tops of the mesas begin to increase in lateral dimensions, thereby beginning to close off the intervening gaps between them, and the deposition must be halted to permit a high temperature annealing step. Annealing of the phosphor serves to densify the structure, essentially regenerating the entire gap width at which point the deposition steps can be repeated until the final thickness of the phosphor is obtained. In this process, the phosphor is deposited at a rapid deposition rate of about 50 microns per minute, and the annealing step takes place at an elevated temperature of about 450° C.

U.S. Pat. No. 5,171,996 and PCT Publn. No. WO 93/03496 disclose a method and apparatus for producing separated columns of scintillation material offering improved spatial resolution. In this method, a pattern of vertical wailed ridges is formed on a substrate and the subsequent deposition of a phosphor over this surface is claimed to form discrete columns of phosphor separated by spaces which can be filled with a material which absorbs light. In this method, the deposition of a wide range of scintillation materials is claimed to form columns where the separation gap between columns is maintained until the columns reach a height not more than 50 times the lateral width of the vertical wailed ridges.

U.S. Pat. No. 5,153,438 discloses an electronic X-ray imaging array made by combining a two-dimensional photosensitive array with a structured scintillator array, having a common array pattern and suitable alignment marks thereon, by coding them face-to-face in alignment for direct coupling of X-ray luminescence from the scintillator array to the photosensitive array.

In view of the foregoing art, it is apparent that what is needed in the industry is a technique whereby a phosphor screen used for converting X-rays can be easily fabricated so that phosphor cells are associated with a single sensor and are isolated from adjacent sensor elements. In particular, it would be desirable to form this phosphor screen in a manner which prevents the substrate onto which it is attached from being subjected to any extreme conditions such as high temperatures which could potentially damage the substrate, since this substrate may be a semiconductor device used for the conversion of photons emitted from the phosphor to an electrical signal.

SUMMARY OF THE INVENTION

In accordance with the present invention, it has now been discovered that the growth of a phosphor layer deposited on a patterned substrate consisting of a multiplicity of raised structures ("mesas") is, in part, controlled by the geometry of the raised structures. In particular, it has been discovered that phosphor which is deposited onto raised structures or mesas which have sloped sides will preferentially grow on surfaces which are parallel to a major surface of the substrate, the deposition of phosphor on the sloped sides of the raised structures being negligible. In those regions of little or no phosphor deposition on the sloped sides of the mesa, cracks are formed which separate the otherwise growing phosphor which is present in other regions of the patterned substrate where more substantial phosphor deposition occurs.

In accordance with the present invention, there is provided a process for forming a phosphor comprising the steps of:

(a) providing a substrate for deposition and growth of an alkali halide phosphor;

(b) forming a patterned surface on the substrate comprising a plurality of mesas, each mesa having an angular inclined slope, an angular declined slope, and a horizontal surface, and each mesa being separated from one another by horizontal segments of the substrate and wherein:

(i) the ratio of the height of each mesa to the width of each horizontal segment of the substrate separating the mesas is in the range of about 1:20 to 1:4;

(ii) the ratio of the width of each mesa to the width of each horizontal segment of the substrate separating the mesas is in the range of about 1: 30 to 1: 4; and (iii) the angles, $\theta$, of incline and decline of each mesa are between about 5° and 85°; and (c) depositing an alkali halide phosphor on the patterned surface of the substrate of step (b), thereby forming cracks, in the deposited phosphor, which originate or emanate from the angular inclined and/or declined slopes of each mesa.

Optionally, the cracked phosphor structure resulting from step (c) is annealed in an inert atmosphere at a temperature of from about 150° to 300° for about 1 to 3 hours.

In one preferred embodiment, the substrate is connected to an array of sensors.

In a second preferred embodiment, the subsrate is connected to a silver halide-based, conventional photographic film used for producing a readable image.

In a third preferred embodiment, the substrate contains a pattern of electrical contacts or other discrete structures corresponding to thin-film semiconductor devices.

In a fourth preferred embodiment, the sloped sides of the mesas referred to in step (b) are made from a multiplicity of discontinuous smaller sloped segments, forming a series of angled steps which when viewed relative to the dimensions of the mesas appear to be a continuous incline or decline, however, each segment of the incline or decline is made from a sloped surface and a surface essentially parallel to the top of the mesa.

In a fifth preferred embodiment, the cracks resulting from step (c) are filled with a light-reflecting or light-absorbing material.

In a sixth preferred embodiment, a protective layer for physically and chemically protecting the phosphor layer is provided on the surface of the phosphor layer intended for exposure to radiation (on the side opposite to the substrate).

The inventive process has the advantage of forming cracks in a phosphor surface utilizing a cool wall vacuum evaporation technique which permits the use of patterned substrates which are otherwise adversely affected by elevated temperatures.

In this application:

"crack" means an empty space or gap which separates one phosphor cell from another;

"array" means a collection of elements arranged in a predetermined order; and

"sensor" means an electronic device for converting electromagnetic radiation into a corresponding electronic signal (e.g., a photodiode or a photoconductor);

"mesa" means a raised structure on the surface of a substrate consisting of a surface essentially parallel to the surface of the substrate and sloped surfaces connecting the top of the structure to the essentially horizontal surface of the substrate, the cross-section of a mesa usually resembling a truncated pyramid with the smaller parallel surface furtherest from the substrate; and "multiplicity of discontinuous steps" means several pairs of connected small surfaces, both parallel to and inclined to a major surface of a substrate, joined together such that these multiple pairs of steps approximate the sloped surfaces of the mesa.

Other aspects, advantages, and benefits of the present invention are apparent from the detailed description, examples, figures, and claims.

DETAILED DESCRIPTION OF THE INVENTION

Figure 1:
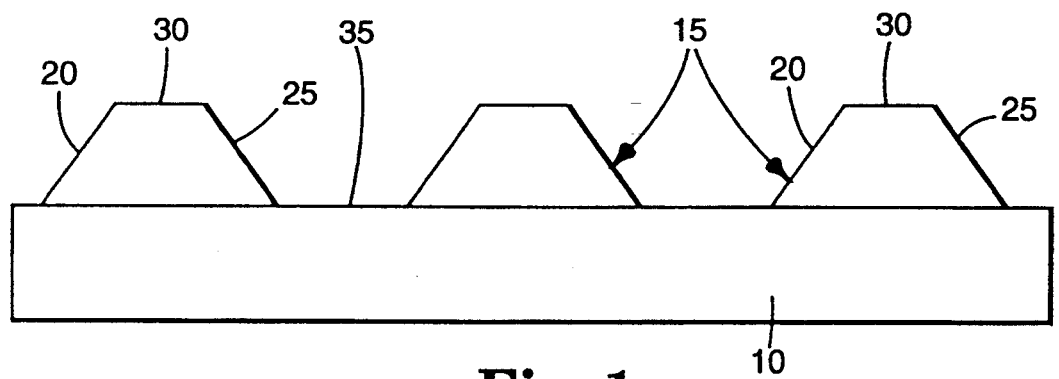
FIG. 1 illustrates a representative pattern of mesas separated by horizontal segments of the surface of a suitable substrate on which a phosphor can be deposited.

Substrate 10 of FIG. 1 can be any material known to those skilled in the art on which an alkali halide phosphor can be deposited.

The support for the phosphor can be various polymeric materials, glass, tempered glass, quartz, metals, and the like. Among them, flexible or easily roll-processable sheet materials are especially suitable in view of the handling of information recording material. From this point of view, the especially preferable material of is, for example, a plastic film such as cellulose acetate, polyvinyl chloride (PVC), plasticized PVC, acrylic, polyester (e.g., polyethylene terephthalate), polyamide, polyimide, cellulose triacetate or polycarbonate film, or metallic sheets such as aluminum, steel, or copper.

The process of forming the phosphor can also be made on a substrate consisting of a sensor array or on a multitude of sensor arrays which can be described as being a "sub-module". A collection of sub-modules can be assembled by butting them together in an "edge-to-edge" manner to form a complete, large-size radiographic imaging panel. The process of forming the phosphor can also be made on the large-size radiographic imaging panel.

The sensor array can be made of amorphous silicon, single crystal silicon, cadmium telluride, copper indium diselenide, and other sensor materials known to one skilled in the art. In the case of single crystal silicon, the sensor array can be a conventional sensor array on a silicon wafer from about 300 to about 700 microns in thickness. Additionally, the sensor array can be on a thinned silicon wafer, preferably from about 10-50 microns in thickness and more preferably, from about 10-20 microns in thickness. A sensor array on a sufficiently thinned silicon wafer has the advantage of being transparent to light so that the phosphor can illuminate the sensor array through the silicon, from the side opposite to the light-detecting sensor. The use of thinned out wafers, butted edge-to-edge, accomplishes a high fill factor to effectively collect the light from the phosphor. This manner of illumination is termed "back-illumination".

Alternatively, the phosphor can also be made on a fiber optic element. The fiber optic element can be composed of a large bundle of individual optical fibers which are joined parallel to each other so that an image projected into one end of the bundle will be transmitted uniformly to the other end of the bundle maintaining a one-to-one correspondence of the relative positions of different portions of the image. The light transmitting surface of this bundle of fiber optics can be sufficiently smoothed by polishing so as to permit the formation of a patterned surface which can then be coated with uniform deposition of a phosphor.

According to the present invention, a patterned surface is formed on the substrate. With reference to FIG. 1, the patterned surface comprises a plurality of mesas 15 with sloped inclines 20 and declines 25. Each mesa 15 also has an essentially horizontal top surface 30. Addition y, each mesa 15 is separated from one another by essentially horizontal segments 35 of substrate 10.

Figure 2:
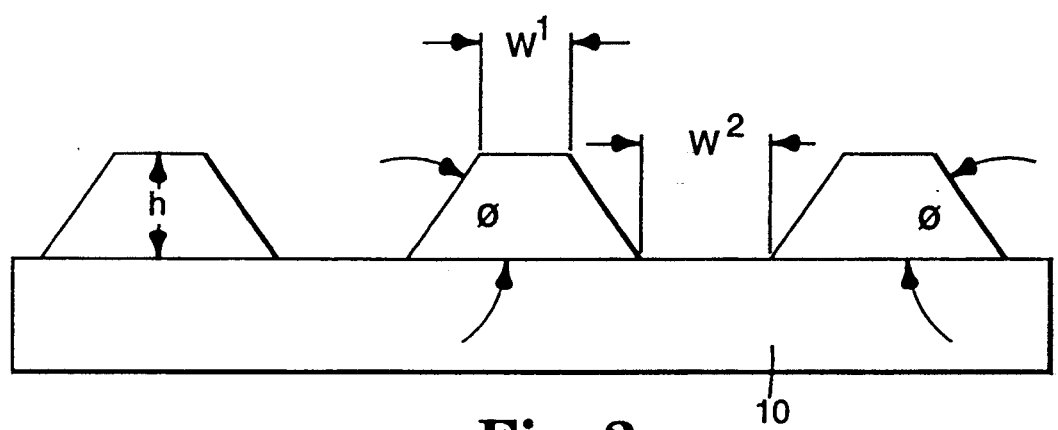
FIG. 2 illustrates the dimensions of mesas and horizontal segments which separate the mesas as well as the angles of incline and decline of each mesa.

With reference to FIG. 2, the ratio of the height h of each mesa to the width $w^2$ of each horizontal segment separating the mesa is from about 1:20 to 1:4; preferably, from about 1:10 to 1:5. The ratio of the width $w^1$ of each mesa to the width $w^2$ of each horizontal segment is from about 1:30 to 1:4; preferably from about 1:20 to 1:8; and more preferably, from about 1:15 to 1:10. The angles of incline and decline, theta ($\theta$), is from about 5° to 85°; preferably, from about 20° to 45°; and more preferably, from about 30° to 40°. Preferably, the angles of incline and decline are of the same degree.

The foregoing predetermined pattern of mesas can be made by any conventional process known to those skilled in the art. Microlithography techniques are typically used, with subsequent chemical etching or physical-chemical etching, or other techniques known to one skilled in the art such as an embossing technique, laser ablation technique, and others. The specific etching method will depend on the type of substrate and the geometry of the pattern desired. As well known to those skilled in the art, the angles, $\theta$, of incline and decline of each mesa can be precisely controlled by the conditions used during the forming press. The desired patterns can also be obtained, for example, by exposing a glass under ultraviolet radiation with a mask, after which the exposed portion becomes crystallized and will be etched away. One of the representative example materials for this use is Fotoglass TM, available from Corning Glass of Corning, N.Y.

After formation of the predetermined pattern of mesas on the surface of the substrate, an alkali halide phosphor is deposited on the patterned surface. Any alkali halide phosphor can be used in the present invention. Non-limiting examples include cesium iodide (CsI), CsI doped with thallium, CsI doped with sodium, rubidium bromide (RbBr) doped with thallium, RbBr doped with sodium, and sodium chloride doped with copper. Presently preferred are CsI or doped CsI.

The first deposition method is vacuum evaporation. In this process, a vacuum evaporating apparatus into which a support has been placed is evacuated to a level of about $10^{-6}$ Torr. Then, at least one aforementioned alkali halide phosphor is vaporized by resistive heating, electron beam heating, or the like to produce a layer of the phosphor with a desired thickness formed on the surface of the support. The layer containing a phosphor can also be formed by repeating the vaporizing procedures a number of times. In addition, a covacuum evaporation can be conducted using a plurality of resistive heaters or electron beams. It is also possible to heat or cool the deposited layer during vaporization, if necessary, or to heat-treat (anneal) the deposited layer after deposition. In this method, the position of the source relative to the position of the substrate is considered as one of the factors to control the way that the crack formation is accomplished.

After the vacuum evaporating operation, the phosphor-containing layer is optionally provided with a protective layer on its side opposite to the support. Alternatively, it is possible to have the phosphor layer formed on a protective layer first, and then to provide it with a support.

The second deposition method is a sputtering technique. In this process, a sputtering apparatus in which a support has been placed is evacuated to about $10^{-6}$ Torr. Then, an inert gas such as Ar or Ne is introduced into the apparatus to raise the inner pressure up to a level of about $10^{-3}$ Torr. Afterwards, at least one aforementioned alkali halide phosphor is sputtered to have a layer of the phosphor with a desired thickness deposited on the surface of the support. The phosphor layer can also be formed by repeating a plurality of sputtering procedures. It is also possible to heat or cool the deposited layer during sputtering, if necessary, or to anneal the deposited layer after deposition.

After the sputtering operation, the phosphor layer is provided with a protective layer on its side opposite to the support if necessary. Alternatively, it is allowed to have the phosphor layer formed on a protective layer first, and then provide it with a support.

The third deposition method is chemical vapor deposition (CVD). In this method, the phosphor layer is obtained on the support by decomposing the intended phosphor or organometallic compound containing the raw material of the phosphor using thermal energy, high-frequency power, and the like.

The presently preferred method is vacuum evaporation. In this method, the temperature of the substrate during deposition is from ambient temperature to about 300° C., preferably from about 100° C. to about 250° C., and more preferably about 125° C. The boat or crucible which contains the phosphor to be deposited is preferably located at a distance of from about 2 inches to about 10 inches from the substrate, and more preferably about 6 inches from the substrate. The rate of deposition of the phosphor is controlled primarily by the boat or crucible configuration and the power supplied to the heaters, as is well known to those skilled in the art. This deposition rate is controlled to be from about 1 to about 10 microns of phosphor deposited per minute.

The thickness of the phosphor layer is varied according to the radiosensitivity of the intended radiographic image panel, and the type of the phosphor, but is preferably selected from a range from 30 $\mu$m to 1000 $\mu$m, especially from 80 $\mu$m to 500 $\mu$m.

When the thickness of the phosphor layer is less than 30 $\mu$m, the radiation absorptance thereof deteriorates rapidly, thereby lowering the radiation sensitivity. The graininess of an image obtained therefrom is increased causing a deteriorated image. In addition to the foregoing, the phosphor layer becomes transparent and thus, the two dimensional spreading of excitation rays in the phosphor layer is greatly increased, which results in the tendency wherein image sharpness is deteriorated.

Optionally, in order to further widen the cracks which are formed in the phosphor during deposition, an annealing step can be added immediately after deposition. This annealing can be done in a furnace at a temperature of preferably from about 150° C. to about 300° C., and more preferably at about 250° C., in the presence of nitrogen, preferably for about 1 to about 3 hours, more preferably about 2 hours. A rapid cooling of the phosphor from this annealing temperature is effective in widening the cracks further.

Also, optionally, a thin layer (e.g., 5000 Angstroms) of a suitable highly light-reflective material, such as aluminum or silver, can be deposited in the cracks. A sputtering, evaporation, electroless plating, plating, or other thin film deposition technique can be utilized.

Also, optionally, a black or light-absorbing material can be deposited to minimize light scattering. This manner of coating will confine the light within a definable boundary; however, the total light output from the phosphor may be decreased due to the absorbing of light by the deposited material.

Optionally, a protective layer for physically and chemically protecting the phosphor layer is generally provided on the surface of the phosphor layer intended for exposure (on the side opposite to the support). The protective layer may be provided on the phosphor layer by directly applying thereto a coating dispersion to form the protective layer thereon, or may be provided thereon or by bonding thereto the protective layer formed beforehand. The material of the protective layer may be a conventional material such as nitrocellulose, ethyl cellulose, cellulose acetate, polyester, polyethylene terephthalate, and the like.

The following non-limiting examples further illustrate the present invention.

EXAMPLE 1

A convex pattern of squares was constructed in a checkerboard pattern on an acrylic substrate using an embossing technique. The squares measured 20 microns on an edge, with scribe lines having a width of 2 microns separating the squares. The squares were convex to a center height of 2 microns. Cesium iodide was loaded into an SM-12 evaporation boat (RD Mathis, Long Beach, Calif.), and placed about 2 inches from the patterned substrate in an evaporative deposition chamber which was evacuated to a pressure of about $10^{-6}$ Torr. A current of about 180 amperes was applied to the boat which resulted in evaporation of the CsI with a deposition rate of phosphor of about 1 micron/minute. The temperature of the walls of the chamber and the substrate were initially at room temperature, but during deposition the temperature of the substrate rose to about 80°–90° C. The deposition continued for about 40 minutes, resulting in a phosphor coating of 40 microns in thickness over the entire surface. Upon examination with a scanning electron microscope (SEM), it was observed that there were no cracks formed along the boundary lines of the pattern.

EXAMPLE 2

A series of 5 micron diameter beads of tin were deposited in a square array on the surface of a substrate consisting of a sheet of PET (polyethylene terephthalate) film. The beads had a center-to-center distance of 30 microns. Cesium iodide was deposited to a thickness of 30 microns using the same conditions as detailed in Example 1. There were no cracks formed at any of the discontinuous boundaries between the tin bead and the PET substrate.

EXAMPLE 3

A rectangular grid pattern was photolithographically etched into a silicon wafer representing one of the slope-sided mesas of this invention. The grid consisted of mesas 18 microns in height, 10 microns in width at the top, with an incline angle of 48°, a decline angle of 37.9°, and a separation gap at the bottom of the sloped sides of 100 microns. The deposition technique described in Example I was used with an aluminum oxide crucible (C5 AO, RD Mathis) replacing the SM-12 evaporation boat. The crucible was located with a 20° vertical offset relative to the surface of the wafer: that is, a line connecting the center of the surface of the silicon wafer to the center of the crucible was at an angle of 20° relative to the normal from the silicon wafer. A total of 60 microns of CsI was deposited onto the patterned surface. A crack having a width of about 3 microns was formed throughout the entire phosphor layer corresponding to the position of the incline of the mesa.

EXAMPLE 4

A rectangular array of square tin mesas with an edge dimension of 30 microns, a height of about 1 micron, and a separation of 10 microns was formed on a PET substrate. A 60 micron layer of CsI was deposited onto the surface using the technique described in Example 1. The CsI covered the entire surface without the formation of any cracks corresponding to the gaps between the structures.

EXAMPLE 5

A square pattern of grooves was photolithographically etched into a silicon wafer representing one of the sloped-sided mesas of this invention. The pattern consisted of mesas 3 microns in height, 3 microns in width at the top, with an incline angle of 80°, a decline angle of 80°, and a separation gap at the bottom of the sloped sides of 90 microns. Using the technique described in Example 1, CsI was deposited to a thickness of 50 microns. A crack was formed within the phosphor at a position corresponding to the sloped surface of the mesa.

EXAMPLE 6

A linear pattern of grooves was photolithographically etched into a silicon wafer representing one of the slope-sided mesas of this invention. The pattern consisted of mesas 4.4 microns in height, 4.8 microns in width at the top, with an incline angle of 36°, a decline angle of 36°, and a separation gap at the bottom of the sloped sides of 1.2 microns. CsI was deposited using the technique of Example 1 to a depth of 60 microns. Examination of the resulting phosphor structure showed the absence of any cracks associated with the sloped sides. The results of this example demonstrate that the relative dimensions of the structures have an impact on the ability to form cracks. In particular, the ratio of the height of the mesa to the separation gap of the mesa in this example is too high for effective crack formation.

EXAMPLE 7

A linear pattern of parallel grooves was embossed into a PET substrate. The grooves were 5 microns in width, 3 microns in depth, and separated by a gap of 100 microns. CsI was deposited as described in Example 1 to a thickness of 60 microns. The phosphor covered the entire area, with cracks propagating throughout the entire surface corresponding to the groove boundaries. The results of this example again demonstrate that the relative dimensions of the structures have an impact on the ability to form cracks. In particular, the width of the gap separating the mesas is too small for effective crack formation.

EXAMPLE 8

A 32×32 array of thin film transistors (TFT's) containing metallized pads having slight inclines and declines was fabricated on a silicon wafer using techniques known to those skilled in the art. This structure was subjected to deposition of CsI using the technique in Example 1. The cracks which were formed in the phosphor coating corresponded exactly to the pattern of the TFT's on the array.

EXAMPLE 9

Two sequential depositions of CsI were made on a silicon wafer with the same patterned structure as Example 3. The depositions were made according to the method disclosed in Example 3, with the exception that the crucible was directly below the substrate (vertical offset angle equals 0°). The first deposition was 100 microns, and a second deposition followed placing an additional 75 microns on the substrate. Examination of the surface of the deposited CsI phosphor layer showed that cracks were formed in the layer. The positions of the cracks in contact with the surface of the substrate were on the sloped sides of the mesa structures, and the cracks emanating from the sloped surface were displaced laterally 20 microns upon reaching the top surface of the phosphor layer. The phosphor screen was annealed at 250° C. for 2 hours and then cooled down rapidly using chill water circulating through the mounting plate. The cracks became more pronounced.

Reasonable variations and modifications are possible from the foregoing disclosure without departing from either the spirit or scope of the present invention as defined in the claims.

What is claimed is:

1. A process for forming an X-ray radiation detector comprising the steps of:
   (a) providing a substrate for deposition and growth of an alkali halide phosphor,
   (b) forming a patterned surface on said substrate comprising a plurality of mesas, each of said mesas having an angular inclined slope, an angular declined slope, and a horizontal surface, and each mesa being separated from each other mesa by horizontal segments of said substrate and wherein:
      (i) the ratio of the height of each of said mesas to the width of said horizontal segments of said substrate separating said mesas is in the range of about 1:20 to 1:4;
      (ii) the ratio of the width of the horizontal surface of each of said mesas to the width of said horizontal segments of said substrate separating said mesas is in the ratio of about 1:30 to 1:4;
      (iii) the angles of incline and decline of each of said mesas are between about 5° to 85°; and
   (c) depositing an alkali halide phosphor on the patterned surface of said substrate of step (b), thereby resulting in formation of cracks, in said deposited phosphor, which originate from the angular inclined and/or declined slopes of each said mesas.

2. The process according to claim 1 wherein said substrate is glass, single crystal silicon, aluminum, nickel, copper, or plastic.

3. The process according to claim 1 wherein said ratio in (b)(i) is about 1:10 to 1:5.

4. The process according to claim 1 wherein said ratio in (b)(ii) is about 1:20 to 1:8.

5. The process according to claim 1 wherein said ratio in (b)(ii) is about 1:15 to 1:10.

6. The process according to claim 1 wherein the angled slopes of incline and decline in (b)(iii) are between about 20° to 45°.

7. The process according to claim 1 wherein the angled slopes of incline and decline in (b)(iii) are between about 30° to 40°.

8. The process according to claim 1 wherein said alkali halide is deposited by vacuum evaporation.

9. The process according to claim 1 wherein said alkali halide is CsI or doped CsI.

10. The process according to claim 1 wherein said alkali halide is doped rubidium bromide.

11. The process according to claim 1 wherein said alkali halide is copper-doped sodium chloride.

12. The process according to claim 1 wherein a light-reflective or light-absorbing material is deposited into said cracks.

13. The process according to claim 12 wherein said light-reflecting material is aluminum.

14. The process according to claim 12 wherein said light-reflecting material is silver.

15. The process according to claim 1 wherein a protective layer is deposited over said phosphor.

16. The process according to claim 1 wherein an array of sensors is disposed on said substrate in (a).

17. The process according to claim 16 wherein said array of sensors is fabricated from single crystal silicon.

18. The process according to claim 17 wherein said array of sensors are formed on back-illuminated thinned-out silicon.

19. The process according to claim 1 wherein a fiber optic element is disposed on said substrate in (a).

20. The process according to claim 1 wherein said substrate in (a) has a multiplicity of sensor sub-modules butted adjacent each other.

21. The process according to claim 1 wherein said inclines and declines are comprised of a multiplicity of discontinuous steps.

22. The process according to claim 1 wherein said patterned surface includes metal electrodes and semiconductor layers.

23. The process according to claim 1 wherein a silver halide-based photographic film used in conventional radiology is disposed on said substrate in (a).

24. The process according to claim 1 further comprising the step of annealing the phosphor structure resulting from step (c) in an inert atmosphere at a temperature of from about 150° to 300° C. for about 1–3 hours.

25. The process of claim 1 wherein the angles of incline and decline for each mesa are of the same degree.

* * * * *